(12) United States Patent
Hurwitz et al.

(10) Patent No.: US 9,049,791 B2
(45) Date of Patent: Jun. 2, 2015

(54) TERMINATIONS AND COUPLINGS BETWEEN CHIPS AND SUBSTRATES

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrates Solutions Technologies Co. Ltd., Zhuhai (CN)

( * ) Notice: Subject to any disclaimer, the term of this patent is extended or adjusted under 35 U.S.C. 154(b) by 26 days.

(21) Appl. No.: 13/912,652

(22) Filed: Jun. 7, 2013

(65) Prior Publication Data

US 2014/0363927 A1    Dec. 11, 2014

(51) Int. Cl.
H01L 23/48    (2006.01)
H01L 23/52    (2006.01)
H01L 29/40    (2006.01)
H05K 1/02    (2006.01)
H01L 23/00    (2006.01)
H05K 1/11    (2006.01)
H05K 3/00    (2006.01)

(52) U.S. Cl.
CPC .............. *H05K 1/0298* (2013.01); *H01L 24/81* (2013.01); *H05K 1/115* (2013.01); *H05K 3/0082* (2013.01)

(58) Field of Classification Search
CPC .............. H01L 24/81; H01L 21/76205; H01L 21/76831
USPC ......... 257/774, 396, 762, 701, 760, 772, 775, 257/411, 643, E21.006, E21.007, E21.126, 257/E21.127, E21.213, E21.231, E21.267, 257/E21.304, E21.499, E21.508
See application file for complete search history.

(56) References Cited

U.S. PATENT DOCUMENTS

| | | | |
|---|---|---|---|
| 6,280,640 B1 * | 8/2001 | Hurwitz et al. | 216/15 |
| 7,268,012 B2 * | 9/2007 | Jiang et al. | 438/106 |
| 7,635,641 B2 * | 12/2009 | Hurwitz et al. | 438/612 |
| 7,669,320 B2 * | 3/2010 | Hurwitz et al. | 29/846 |

* cited by examiner

Primary Examiner — David Nhu
(74) Attorney, Agent, or Firm — Wiggin and Dana LLP; Gregory S. Rosenblatt; Jonathan D. Hall (57) ABSTRACT

A method of attaching a chip to the substrate with an outer layer consisting of via pillars embedded in a dielectric such as solder mask, with ends of the via pillars flush with said dielectric, the method consisting of optionally removing an organic varnish, positioning a chip having legs terminated with solder bumps in contact with exposed ends of the via pillars, and applying heat to melt the solder bumps and to wet the ends of the vias with solder.

29 Claims, 4 Drawing Sheets

TERMINATIONS AND COUPLINGS BETWEEN CHIPS AND SUBSTRATES

BACKGROUND

1. Field of the Disclosure

The present invention is directed to terminating interconnect structures and to coupling between chips and substrates.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough sides walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may result in stray inductances.

The filling process of the drilled via holes is usually achieved by copper electroplating. Electroplating into a drilled hole may result in dimpling, where a small crater appears at the end of the via. Alternatively, overfill may result, where a via channel is filled with more copper than it can hold, and a domed upper surface that protrudes over the surrounding material is created. Both dimpling and overfill tend to create difficulties when subsequently stacking vias one on end of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

Although the range of acceptable sizes and reliability is improving over time, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

Laser drilled vias in composite dielectric materials are practically limited to a minimum diameter of $60 \times 10^{-6}$ m, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern, and selectively removed to make trenches that expose the seed layer. Via posts are created by depositing Copper into the photo-resist trenches. The remaining photo-resist is then removed, the seed layer is etched away, and a dielectric material that is typically a polymer impregnated glass fiber mat, is laminated thereover and therearound to encase the via posts. Various techniques and processes can then be used to planarize the dielectric material, removing part of it to expose the ends of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited on end of the substrate, and a pattern is developed therein. The pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner, lighter and more powerful products having high reliability. The use of thick, cored interconnects, prevents ultra-thin products being attainable. To create ever higher densities of structures in the interconnect IC substrate or 'interposer', ever more layers of ever smaller connections are required. Indeed, sometimes it is desirable to stack components on end of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or via post features having various geometrical shapes and forms in a dielectric matrix. The metal may be copper and the dielectric may be a fiber reinforced polymer, typically a polymer with a high glass transition temperature ($T_g$) is used, such as polyimide, for example. These interconnects may be cored or coreless, and may include cavities for stacking components. They may have odd or even numbers of layers and the via may have non circular shapes. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures, includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second half stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

The via post technology described in U.S. Pat. No. 7,682,972, U.S. Pat. No. 7,669,320 and U.S. Pat. No. 7,635,641 lends itself to mass production, with very large numbers of vias being simultaneously electroplated. As mentioned above, current drill & fill vias have an effective minimal diameter of about 60 microns. In contradistinction, via post technology using photo resist and electroplating, enables higher densities of vias to be obtained. Via diameters of as little as 30 micron diameter are possible and various via geometries and shapes could be cofabricated within the same layer.

Over time, it is anticipated that both drill & fill technologies and via post deposition will enable fabrication of substrates with further miniaturization and higher densities of vias and features. Nevertheless, it would appear likely that developments in via post technology will maintain a competitive edge.

Substrates enable chips to interface with other components. Chips have to be bonded to substrates in a manner that provides reliable electronic connections to enable electronic communication between chips and substrates.

Among the high density leading technology to interconnect the Substrate to Chips is the well established "Flip Chip technology" in which Solder bumps, Lead free solder bumps, or copper bumps having solder or lead free solder on their tips, are grown on the Chip terminating pads and the Chip is then flipped over to interconnect its bumps on the top surface pads of the Substrate. As Chip bumps and pitches are becoming denser, advanced Substrates are usually equipped with bumps of their own to assist with the interconnection to the chip bumps. Such bumps on the substrate pads are also known as "SoP" (Solder on Pad") bumps—and usually consist of solder or lead free solder. They are generally applied to the substrate terminating pads by stencil printing followed by reflow, or by electro-less or electroplating processes followed by reflow.

When the Chip bumps come in contact with the SoP bumps through reflow, the solder material of the SoP bumps helps to generate a reliable mechanical and electronic contact with the Chip bump. Without the SoP, the solder material of the chip bumps may not be sufficient or may not be able to completely flow and wet the entire surface of the substrate's terminating pad thereby creating a reliability hazard or even a disconnect between the chip and the substrate. This is an especially a valid concern since most of the substrates have a solder mask external protective layer that by nature extends above the terminating substrate pads thereby making these pads difficult to access without the SoP bumps.

It is known to those familiar in the art that the size and pitch of Chip bumps must be aligned as much possible to those of the SoP bumps. With ongoing developments in chip technology, chips become ever denser, and connection bumps will become ever denser as ever higher concentrations of contacts are required. Consequently, the application of SoP bumps on the substrate becomes ever more challenging. The application of SoP is by nature, a lower yield process than earlier substrate manufacturing steps, and it is one of the final processing steps in the substrate fabrication, thereby increasing scarp, rework, test and cost rates. Additionally, the more fine the pitch of subsequent generations of SoP bumps, the greater the likelihood of failure by shorting between adjacent bumps after reflow and during chip assembly will be, thereby further reducing yields and increasing the total package cost.

As post sizes shrink, it becomes ever more difficult to keep individual wires electronically isolated from each other to prevent shorting. Soldering is also tricky, in that too little solder may result in some connections being broken. However, too much solder risks shorting between nearby connections.

Embodiments of the present invention address these issues.

BRIEF SUMMARY

There is a need to find a new structure for interconnecting between the terminating pads of a substrate and the flip chip bumps. The new structure is required to have high yields, less limited pitch and lower unit cost that currently available SoP bump structures.

A new structure is required to ensure that finer pitch flip chip bumps with low or limited volume of solder material can still be reliably and directly connected to the substrate termination pads.

It is desirable for such a technology to use low cost, existing, solder mask solution structures over the substrate top conductor surface but with a substantially similar level to the Copper termination pads so to allow easy access and flow of solder material to these pads.

It is further desirable to find a technology that can support terminating flip chip substrate pads with non-circular pad termination to assist with creating a larger contact area between these pads and the flip chip bumps and to help with routing conductors on areas of substrate whose 'real estate' is limited by such pads.

Embodiments of the invention are directed to a multilayer composite electronic structure comprising at least one pair of feature layers extending in an X-Y plane, each adjacent pair of feature layer being separated by an inner via layer, the via layer comprising via posts that couple adjacent feature layers in a Z direction perpendicular to the X-Y plane, the via posts being embedded in an inner layer dielectric, the multilayer composite structure further comprising terminations consisting of an outer layer of via pillars embedded in an outer dielectric material, thinned to expose ends of the outer layer of via pillars.

Typically, the exposed outer layer of via pillars is interconnectable with flip chip bumps.

Preferably, the thinned outer layer of via pillars with exposed ends embedded in an outer dielectric material is substantially planar.

Typically, the thinned outer layer of via pillars with exposed ends embedded in an outer dielectric material has a roughness of less than 3 microns.

Optionally, the via pillars are connected to the flip chip bumps by a solderable metal through reflow.

Alternatively, the via pillars are connected to the flip chip bumps by a Z-conductive anisotropic adhesive material.

In some embodiments, at least one of either the via pillars or the underlying terminations pads is not circular in shape.

In some embodiments, at least one of the via pillars or the terminations pads has a shape selected from oval, square, rectangular and oblong.

Typically, the outer dielectric layer comprises polymer.

Optionally, the outer dielectric layer comprises solder mask.

Optionally, the outer via pillars comprise copper.

In some embodiments, the multilayer composite electronic structure as dispatched to customers, further comprises an organic varnish applied over exposed ends of the outer via pillars to prevent oxidation of the via post metal.

In some embodiments, the multilayer composite electronic structure as dispatched to customers has the outer via pillars terminated with gold or nickel to prevent oxidation.

Optionally, at least one outer layer via pillar has a diameter of less than 50 microns.

Optionally, at least one outer layer via pillar has a diameter of less than 40 microns.

Optionally, at least one outer layer via pillar has a diameter of 30 microns or less.

Optionally, the thickness of the multilayer composite electronic structure in the Z direction exceeds 50 microns.

Optionally, a termination pad layer and the at least one outer via pillar layer may be fabricated by a process comprising the steps of:
(a) obtaining a substrate including an underlying via post layer that is treated to expose the copper thereof;
(b) covering the substrate with a seed layer;
(c) applying a first layer of photo resist over the seed layer;
(d) exposing and developing the photo resist to form a negative pattern of termination pads;
(e) depositing metal into the negative pattern to fabricate the feature layer;
(f) stripping away the first layer of photo resist;
(g) applying a second layer of photo resist;
(h) exposing and developing a negative pattern including a plurality of outer via pillars in the negative pattern;
(i) depositing a metal layer into the negative pattern;
(j) stripping away the photo resist leaving the feature layer and the plurality of outer via pillars upstanding;
(k) removing the seed layer,
(l) laminating a dielectric material over the plurality of via pillars in the outer via layer,
(m) planarizing the dielectric material to expose ends of the plurality of via pillars.

In some embodiments, the dielectric layer is a solder mask.

In some embodiments, at least one of the following limitations applies: (i) the seed layer comprises copper; (ii) the metal layer comprises copper; (iii) the dielectric material comprises a polymer, (iv) the dielectric material further comprises ceramic or glass inclusions.

In some embodiments, the method comprises the further step: (n1) of applying an organic varnish over exposed ends of the copper pillars in the outer layer of via pillars.

In other embodiments, the method comprises the further step (n2) of depositing nickel or gold over exposed ends of the copper via pillars in the outer layer of via pillars.

In an alternative process, the at least one outer via pillar layer is fabricated by the steps of:
(i) obtaining a substrate including an underlying feature layer where the copper thereof is exposed;
(ii) covering the substrate with a seed layer;
(iii) depositing a metal layer over the seed layer;
(iv) applying a layer of photo resist over the metal layer;
(v) exposing and developing a positive pattern of outer via pillars;
(vi) etching away the metal layer exposed;
(vii) stripping away the photo resist, leaving a plurality of via pillars in the outer via layer upstanding,
(viii) removing the seed layer;
(xi) laminating an outer dielectric material over the plurality of via pillars in the outer layer, and
(x) planarizing and thinning to expose the metal of the outer layer of via pillars.

In some embodiments, at least one of the following limitations applies: (a) the seed layer comprises copper; (b) the via pillar layer comprises copper; (c) the outer dielectric material comprises a polymer, and (d) the outer dielectric material comprises solder mask.

In some embodiments, the method further comprises the step: (x) a of a depositing a varnish over the exposed ends of the via pillars.

In other embodiments, the method further comprises the step (x) b of depositing gold or nickel over the exposed ends of the outer via pillars.

A third aspect is directed to a method of attaching a chip to a substrate having an outer layer comprising via pillars embedded in a dielectric, with ends of said via pillars flush with said dielectric, the method comprising the steps of:
(p) positioning a chip having legs terminated with solder bumps in contact with exposed ends of the via pillars, and
(q) applying heat to melt the solder bumps and to wet the ends of the outer vias with solder.

Optionally, the method further comprises the preliminary step (o) of removing an organic varnish to expose the ends of the copper via pillars.

An alternative method of attaching a chip to a substrate with an outer layer comprising via pillars embedded in a dielectric, with ends of said via pillars flush with said dielectric, comprising the steps of:
(p) positioning a chip having legs terminated with a Z-directional anisotropic conductive film in contact with exposed ends of the via pillars of the substrate, and
(q) applying pressure in the Z-direction.

The term microns or µm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. No. 7,682,972, U.S. Pat. No. 7,669,320 and U.S. Pat. No. 7,635,641 to Hurwitz et al., incorporated herein by reference, that large panels comprising very large arrays of substrates with very many via posts may be fabricated. Such panels are substantially flat and substantially smooth.

It is a further feature of Access' technology that vias fabricated by electroplating using photoresists and may be narrower than vias created by drill & fill. At present, the narrowest drill & fill vias are about 60 microns. By electroplating using photoresists, a resolution of under 50 microns, or even as little as 30 microns is achievable.

Figure 1:
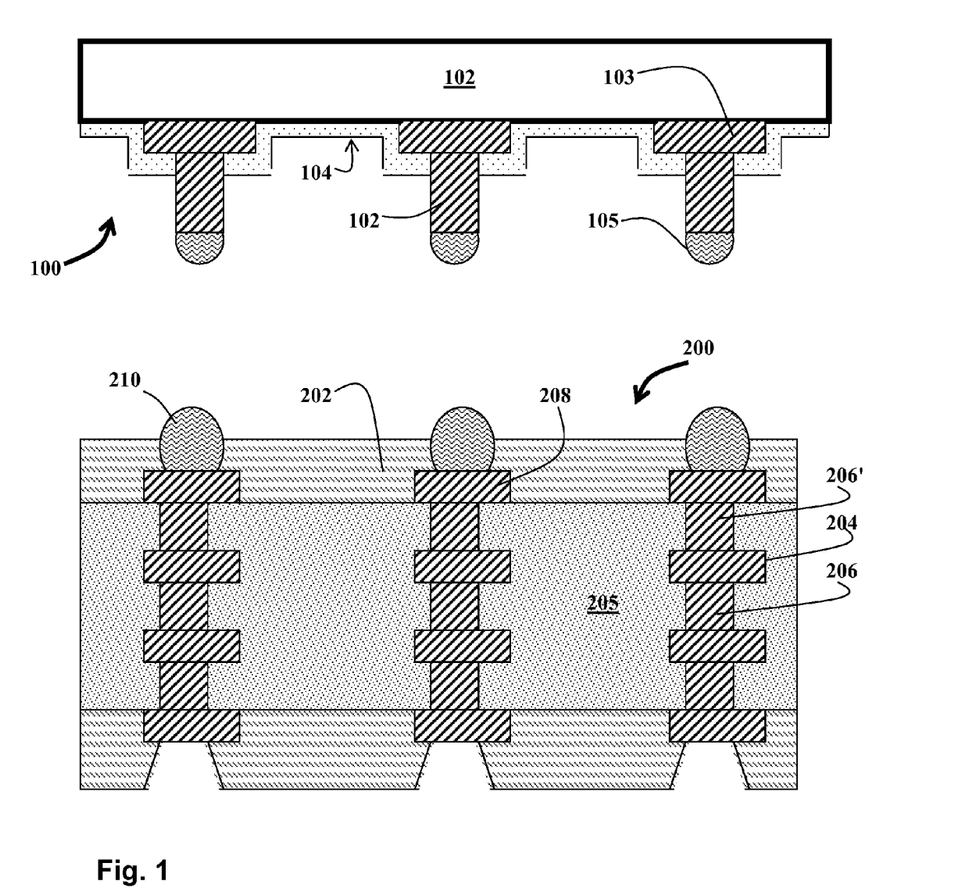
FIG. 1 is a simplified section through a prior art multilayer composite support structure having SoP bumps joined to termination pads on the Substrate, also showing a chip with corresponding solder bumps positioned for connecting thereto as a flip chip.

FIG. 1 shows a terminated chip 100 that consists of the chip 101 itself, and is equipped with Copper bumps 102 over its terminating pads 103 and provided with a protective passivation layer 104. The copper bumps 102 have solder or lead free solder tips 105 ready to make contact through reflow with the SoP bumps 210 of the substrate 200. The substrate 200 of the prior art generally consists of layers of feature layers 204 coupled by via layers 206 and encapsulated in a dielectric material 205 that is typically polymer reinforced with glass fibers, and ending with a multiplicity of terminating substrate pads 208 separated and insulated from each other by a layer of solder mask 202. SoP bumps 210 connected to the substrate pads 210 are provided. When the Chip bumps 105 come into contact with the SoP bumps 210 and heat is applied during a reflow process, the solder material of the SoP bumps 205 fuse with the Chip bumps 105 and a reliable adhesive and electronic contact is generated.

Where vias are fabricated with drill & fill technology, the vias generally have a substantially circular cross-section, as they are fabricated by first drilling a laser hole in the dielectric. Since the dielectric is heterogeneous and anisotropic, and consists of a polymer matrix with inorganic fillers and glass fiber reinforcements, the circular cross-section thereof is typically rough edged and the cross-sections thereof may be slightly distorted from a true circular shape. Furthermore, the vias tend to taper somewhat, being inverse frusto-conical instead of cylindrical. Finally, the narrowest vias obtainable have a diameter of about 60 microns. It is expected, however, that over time, this dimension will shrink, enabling greater miniaturization and more dense packing.

As described in U.S. Pat. No. 7,682,972, U.S. Pat. No. 7,669,320 and U.S. Pat. No. 7,635,641, for example, the main structure of the substrate 200 FIG. 1 may alternatively be fabricated by plating in a pattern in a photo-resist (pattern plating), or panel plating and then selectively etching, either way leaving up standing via posts, and then laminating a dielectric material thereover. For ease of processing and rigidity, the dielectric used for fabricating inner via layers may be a prepreg consisting of woven bundles of glass fibers impregnated with a polymer matrix.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill (doming) that characterize drill & fill technology are exasperated, since it is impossible to simultaneously optimize deposition techniques for different sized vias. Thus in practical applications, drill and fill vias have substantially circular cross-sections albeit sometimes distorted somewhat due to the heterogeneous nature of the substrate, and all vias have substantially similar cross-sections.

Furthermore, it will be noted that laser drilled vias in composite dielectric materials such as polyimide/glass or epoxy/glass or BT (Bismaleimide/Triazine)/glass or their blends with ceramic and/or other filler particles, are practically limited to about $60 \times 10^{-6}$ m diameter, and even so suffer from significant tapering shape as well as rough side walls due to the nature of the composite material drilled, in consequence of the ablation process involved.

Using the flexibility of the plating and photo-resist techniques, it has been found that a wide range of via shapes and sizes may be cost-effectively fabricated. Furthermore, different via shapes and sizes may be fabricated in the same layer. This is especially facilitated when the copper pattern plating approach is used, by first depositing a metal seed layer and then depositing a photo-resist material and developing smooth, straight, non-tapering trenches therein which may subsequently be filled by depositing copper into these trenches by pattern plating onto the exposed seed layer. In contrast to the drilled & filled via approach, via post technology enables trenches in a photoresist layer to be filled to obtain dimple-less and dome-less copper connectors. After deposition of the copper, the photoresist is subsequent stripped away, the metal seed layer is removed and a permanent dielectric is applied thereover and therearound. The 'via conductor' structure thus created may use the process flows as described in U.S. Pat. No. 7,682,972, U.S. Pat. No. 7,669,320 and U.S. Pat. No. 7,635,641 to Hurwitz et al.

Using electroplating, micro-vias having diameters of approximately 30 microns have been achieved. The separation between the micro-vias may be less than 20 microns. Drill and fill technology does not allow fabrication of such small vias, and the current state of the art has an effective lower limit of about 60 micron diameter for drill and fill vias.

Optionally, as with the prior art, the various vias may have substantially circular cross-sections in the X-Y plane. Furthermore, since the via posts are fabricated by plating into photoresist and then a dielectric is applied therearound, it is possible to achieve much smoother vias by the electroplating technology, than is achievable by drill & fill, where the heterogeneity and anisotroscopy of the dielectric may create a rough surfaced hole.

However, unlike vias created by the drill & fill technology, vias fabricated by the plating approach need not be circular. Vias may be asymmetrical in the X-Y plane. They may, for example, extend in a first direction in the X-Y plane, at least three times the extension in a second direction in the X-Y plane that is perpendicular to the first direction, and be more linear.

Whereas drill & fill vias are effectively limited to about 60 microns in diameter due to the dimpling or doming effect, in some embodiments where vias are created by electroplating, at least one via has a diameter of less than 50 microns, perhaps less than 40 microns. Indeed, in some embodiments, at least one via may have a diameter of 30 microns or less.

By embedding the via posts in a dielectric and polishing to expose the ends of the via posts, it is possible to obtain substantially flat arrays with a surface roughness of less than 3 microns.

The termination pads 208 may have a finer pitch, but this makes accurate coupling of a chip thereto more challenging.

Figure 2:
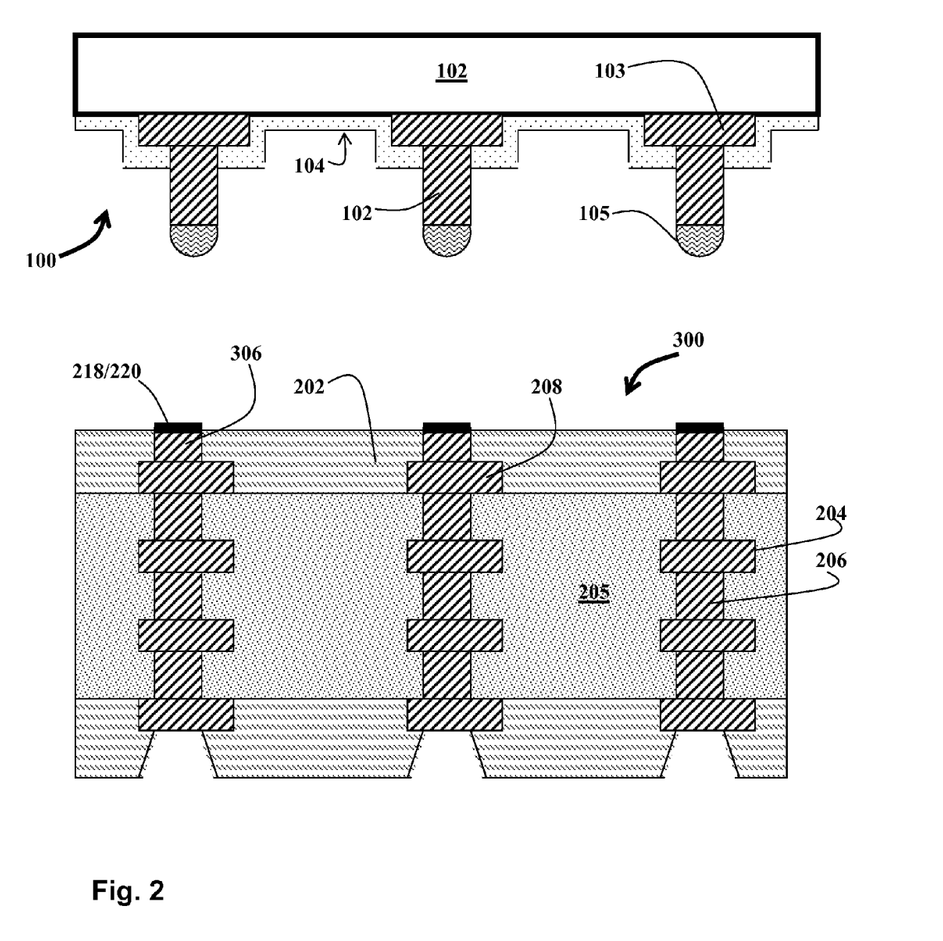
FIG. 2 is a schematic section through the substrate of FIG. 1 having a new substrate termination structure for receiving the chip of FIG. 1.

With reference to FIG. 2, the chip 100 of FIG. 1 is shown together with a substrate 300 and aligned for connection thereto.

Substrate 300 consists of copper feature layers 204 coupled together by vias 206 and is substantially similar to substrate 200, mutatis mutandis. It will be appreciated that the number of internals layers, the via and feature density of the substrate 200 can and does vary tremendously. The substrate 300 shown, with two internal feature layers and three vias stacks is a schematic simplified section for illustrative purposes only.

A novel termination structure and process that facilitates greater miniaturization with high reliability, good yields and less wastage is now described.

An array of copper termination pillars 306 is fabricated, typically by pattern electroplating into a photo resist, or by panel electroplating and etching away superfluous material using processes described below. Solder mask 202 is now laid down over and around the copper termination pillars 306 and the solder mask 202, copper termination pillar 306 structure is polished flat, exposing the tops of the pillars 306. mechanical, chemical or chemical mechanical polishing (CMP) may be used. With CMP a surface finish that is substantially smooth and flat, varying by less than 3 microns over an entire array is achievable.

The exposed tops of the copper pillars 306 may be covered with an organic varnish 218. that can be removed with an appropriate organic solvent that dissolves the varnish 218 but not the solder mask 202. Alternatively, the exposed copper of the outer layer of copper pillars 306 may be coated with nickel or gold 220.

By coupling the solder bumps 105 of the terminated chip 100 to copper pillars 306, minimum solder is used. Nevertheless, due largely to the substantial planarity and smoothness resulting from the thinning process used to expose the ends of the outer layer of vias 306, the resulting soldered connections are extremely reliable, and it is possible to achieve high reliability and good yields with a low incidence of shorting and disconnects when compared to the prior art as illustrated in FIG. 1.

Figure 3:
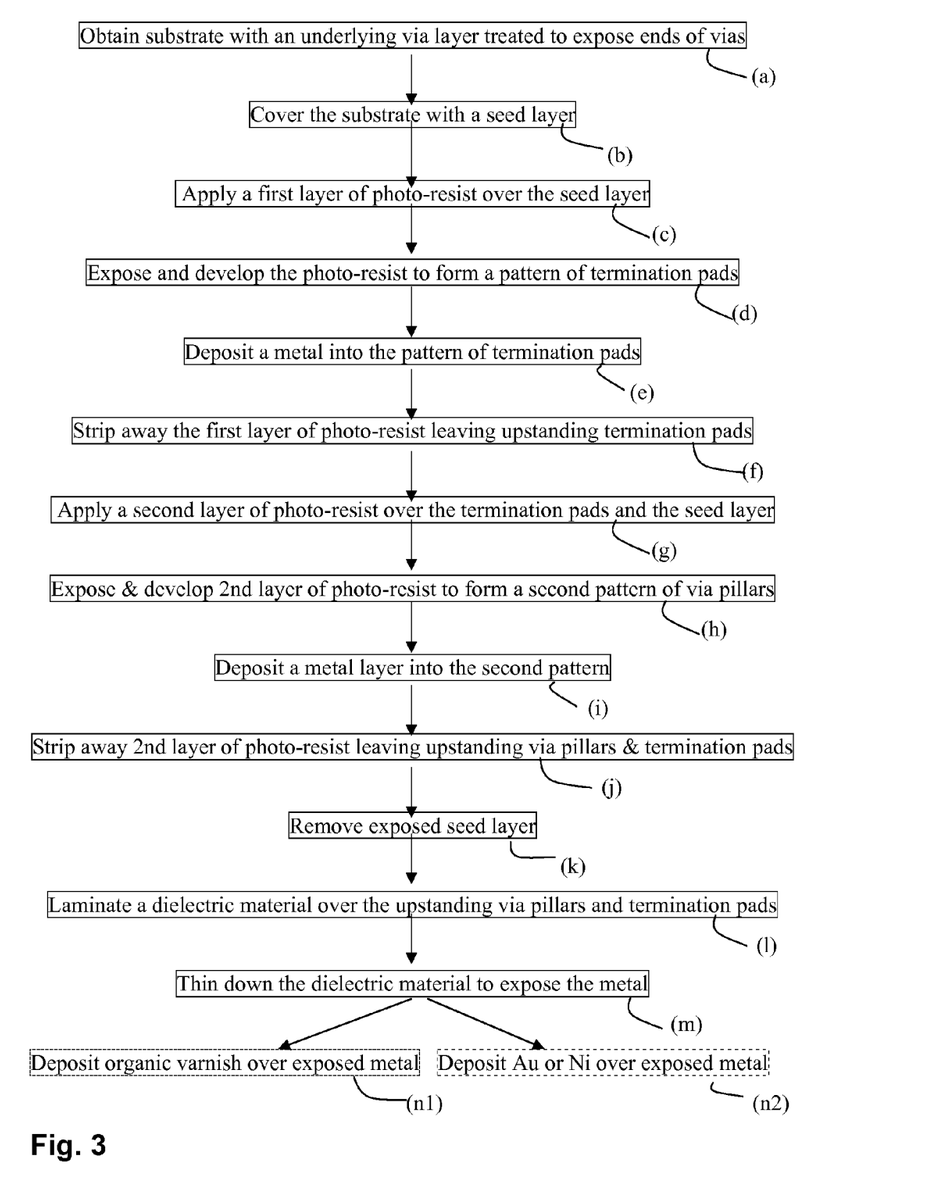
FIG. 3 is one flowchart showing one process by which structures of the invention may be fabricated.

Referring to FIG. 3, in some embodiments, the at least one outer via layer is fabricated by a process consisting of the following steps: obtaining a substrate including an underlying via layer 206' that is treated to expose the copper thereof—step (a), and covering the substrate with a seed layer, typically copper—step (b). A first, thin layer of photoresist is applied over the seed layer—step (c), and the first, thin layer of photoresist is exposed and developed to form a negative pattern of features—step (d). A metal, typically copper, is deposited into the negative pattern of features—step (e) to create a layer of pads 208, and the first thin layer of photoresist is stripped away—step (f) leaving the layer of pads 208 upstanding. A second, thicker layer of photoresist is now applied—step (g) and a second negative pattern of via pillars 306 is exposed and developed therein—step (h). A layer of metal, typically copper, is deposited in the trenches developed in the second pattern—step (i) to fabricate the outer via pillar layer that includes via pillars 306. It will be noted that the various via pillars 306 may have different dimensions from each other. Furthermore, their cross sections need not be round, but could be oval, square or rectangular, for example. This flexibility enables high packing density.

The second layer of photoresist is stripped away—step (j) leaving the layer of outer via pillars 306 and the underlying layer of pads 208 upstanding. The exposed seed layer is now removed—step (k). This may be accomplished by exposing the structure to a wet etching process, using ammonium hydroxide or copper chloride, for example. A solder mask material is then deposited over the outer layer of via pillars 306—step (l).

The method of depositing layers of outer via pillars 306 is substantially similar to that used for inner layers of via posts 206, where, for further build up and rigidity, the dielectric material is generally a composite material comprising a polymer matrix, such as polyimide, epoxy, Bismaleimide, Triazine and blends thereof, and may further comprise ceramic or glass. Typically the dielectric used for inner layers of the substrate 200 is provided as a prepreg consisting of woven glass fiber bundles in a polymer resin pre-preg with ceramic fillers. For an outer layer, a cheaper material such as a solder mask 202 may be used. The solder mask 202 or other dielectric material may be thinned to expose the metal ends of outer via pillars 306—step (m). The thinning may be accomplished using mechanical grinding or polishing, chemical polishing, or chemical mechanical polishing CMP. The thinning also planarizes the outer surface of the substrate 200.

The facility of fabricating shaped vias enables greater packing density by allowing square, rectangular or elliptic via ends and termination pads. These can have higher packing densities in the X-Y plane while allowing conductor routing along these vias 306 in the Z (through substrate) direction.

A terminated chip 100 may be soldered to the exposed copper ends of the outer via pillars 306. For transportation and storage, since copper is easily oxidized, the exposed copper at the ends of the outer via pillars 306 may be covered with an organic varnish 218—step (n1) that can be removed with an appropriate organic solvent that dissolves the varnish 218 but not the solder mask 202. Alternatively, the exposed copper of the outer layer of vias 306 may be coated with nickel or gold 220—step (n2).

Figure 4:
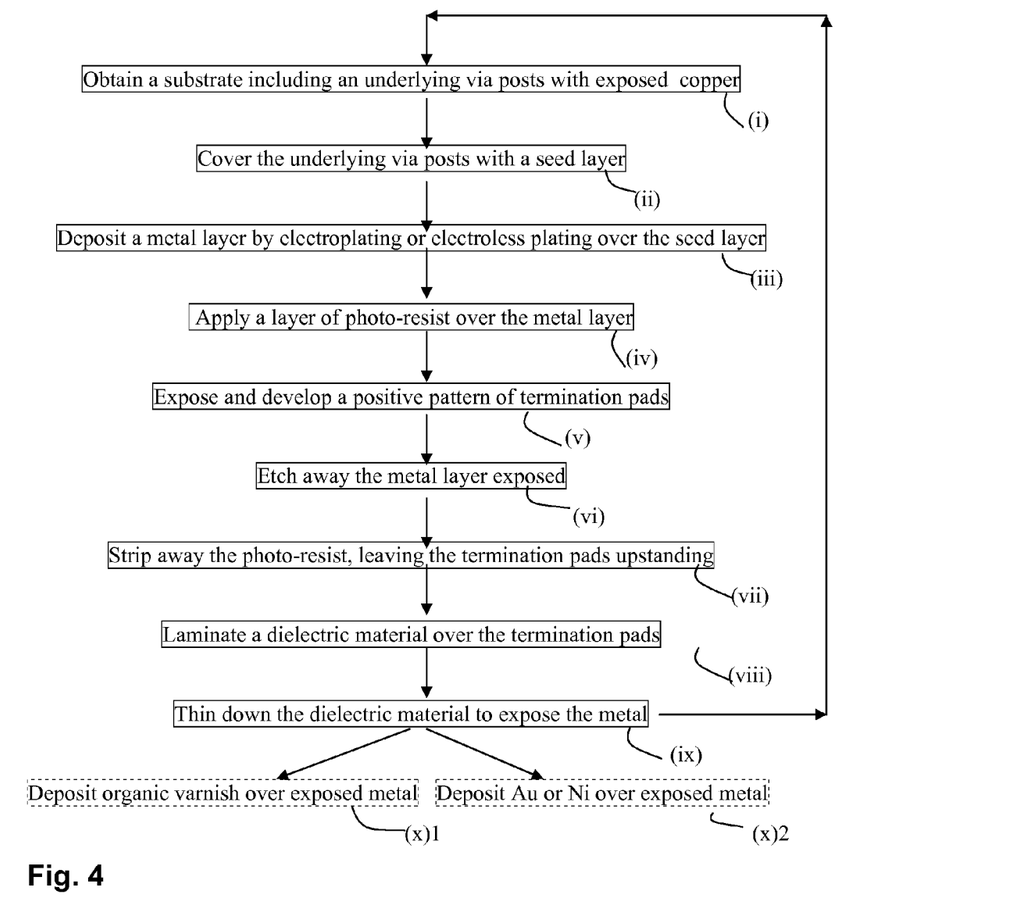
FIG. 4 is a second flowchart showing a variant process by which structures of the invention may be fabricated.

Referring to FIG. 4, in a variant fabrication route, the outer layer of via termination pillars 306 may be fabricated by the steps of: obtaining a substrate including an underlying layer of via posts 206 that is planarized to expose the copper thereof—step (i), and covering the underlying via layer 206 with a seed layer—step (ii) which is typically copper and is typically deposited by sputtering or by electroless plating. A metal layer is deposited over the seed layer—step (iii). This metal layer is typically copper, and may be deposited by electroplating. A layer of photoresist is laid down over the metal layer—step (iv), and a positive pattern of termination pads 208 is exposed and developed therein—step (v). The metal layer exposed is etched away—step (vi). The etching away of copper may be performed using a copper etchant, such as ammonium hydroxide or copper chloride, for example. The photoresist is then stripped away—step (vii), leaving via layer upstanding, and a dielectric material 202 is laminated over the layer of termination pads 208—step (viii). The dielectric material 202 may be a prepreg, but to keep costs down, it may be a simple polymer or a solder mask, for example.

The dielectric layer 202 may be thinned—step (ix) to expose the surface of the termination pads 208, using chemical or mechanical polishing or grinding, or chemical mechanical polishing, for example. The thinning also planarizes the layer of termination pads 208.

Steps (i) to (ix) may be repeated to deposit via pillars 306 on to the termination pads 208 for coupling to the terminations 102 of the termination chip 105.

Alternatively, the termination pads may be made thicker.

For transportation and storage, since copper is easily oxidized, the exposed copper may be covered with an organic varnish 218—step (x) a that can be removed with an appropriate solvent, leaving the solder mask 216. Alternatively, the exposed copper may be coated with nickel or gold 220—step (x) b. As described hereinbelow with reference to FIG. 5, a chip 100 may be soldered to the exposed copper ends of the outer layer of vias 306.

Figure 5:
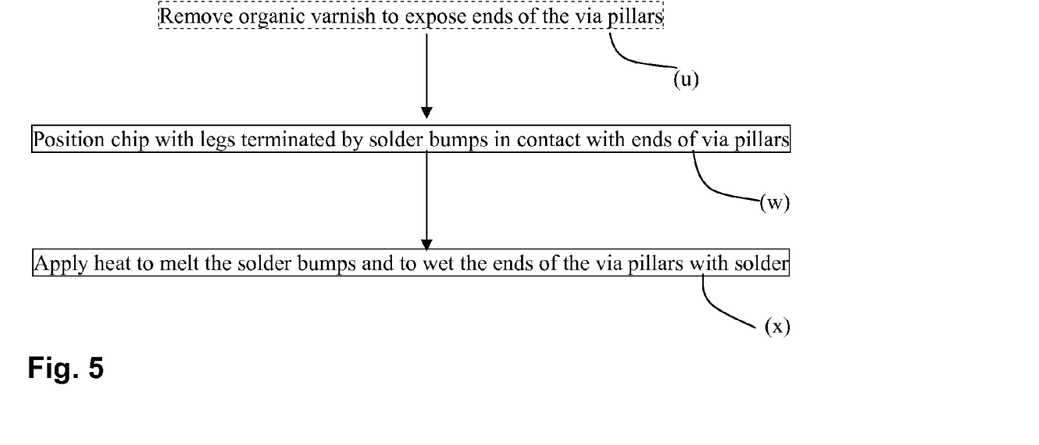
FIG. 5 is flowchart showing a method by which chips may be attached to substrate structures.

With reference now to FIG. 2 and FIG. 5, a method of attaching a chip 100 to a substrate 300 having an outer layer comprising via posts 208 embedded in dielectric 202, typically solder mask, with the ends of the via posts 208 flush with the dielectric 202 is now described. The method comprising the steps of: (o) removing organic varnish 218 if provided to keep the via posts 208 which are typically copper, from oxidizing; (p) positioning a terminated chip 100 having legs 102 terminated with solder bumps 105 in contact with the exposed ends of the vias 208, and (q) applying heat to melt the solder bumps 105 and to wet the ends of the vias 208 with solder.

As a result of the chemical, mechanical or chemical mechanical polishing used to expose the ends of the outer layer of vias 208; the entire array of substrates 300 is substantially flat and may be smooth to a roughness of less than 3 microns. This facilitates soldering using micro bumps 105 of solder on the legs of chips 102 of the terminated chip 100 only, since the flatness of the substrates 300 leaves little risk of non-contact. Since very little solder is required, the risk of shorting between adjacent vias pillars 208a, 208b is minimal.

Thus it is possible to create a substrate 300 with terminations 208 that have diameters of less than 60 microns, and currently diameters of 30 microns are possible. Chips 100 may be soldered to these terminations 208 with minimum amounts of solder 105.

Indeed, it is possible to couple the flip chip bumps 102 of a chip 100 to the via pillars 208 without solder at all, by using a Z-conductive anisotropic adhesive material.

Anisotropic conductive film, commonly known as ACF, is a lead-free and environmentally-friendly adhesive system that has been used for more than 30 years in the flat panel display industry to make the electrical and mechanical connections from the drive electronics to the glass substrates of the displays.

Chip-on-glass (COG) applications now commonly use ACF at pitches down to 25 um and spaces of 10 um while anisotropic chip-on-flex (aCOF) has stabilized in the 40 um pitch range as a standard technology. A single one of these driver chips can have more than 1300 pads that are all simultaneously interconnected during the ACF assembly process. Compared to COG and aCOF, aCOB (anisotropic chip-on-board) assemblies are still in their infancy. They have, however made great strides in the past several years in applications requiring high density and low profile characteristics in a robust and cost-sensitive package.

The above description is provided by way of explanation only. It will be appreciated that the present invention is capable of many variations.

Several embodiments of the present invention have been described. Nevertheless, it will be understood that various modifications may be made without departing from the spirit and scope of the invention. Accordingly, other embodiments are within the scope of the following claims.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A multilayer composite electronic structure comprising at least one pair of feature layers extending in an X-Y plane, each adjacent pair of feature layers being separated by an inner via layer, the via layer comprising via posts that couple adjacent feature layers in a Z direction perpendicular to the X-Y plane, the via posts being embedded in an inner layer dielectric, the multilayer composite electronic structure further comprising termination pads consisting of an outer layer of via pillars embedded in an outer dielectric material, thinned to expose ends of the outer layer of via pillars.

2. The multilayer composite electronic structure of claim 1, wherein the exposed outer layer of via pillars is interconnectable with flip chip bumps.

3. The multilayer composite electronic structure of claim 1, wherein the thinned outer layer of via pillars with exposed ends embedded in an outer dielectric material is substantially planar.

4. The multilayer composite electronic structure of claim 3, wherein the thinned outer layer of via pillars with exposed ends embedded in an outer dielectric material has a roughness of less than 3 microns.

5. The multilayer composite electronic structure of claim 2, wherein the via pillars are connected to the flip chip bumps by a solderable metal through reflow.

6. The multilayer composite electronic structure of claim 2, wherein the via pillars are connected to the flip chip bumps by a Z-conductive anisotropic adhesive material.

7. The multilayer composite electronic structure of claim 2, wherein at least one of either the via pillars or the underlying terminations pads is not circular in shape.

8. The multilayer composite electronic structure of claim 7, wherein said at least one of the via pillars or the terminations pads has a shape selected from oval, square, rectangular and oblong.

9. The multilayer composite electronic structure of claim 1, wherein the outer dielectric layer comprises polymer.

10. The multilayer composite electronic structure of claim 1, wherein the outer dielectric layer comprises solder mask.

11. The multilayer composite electronic structure of claim 1, wherein the outer via pillars comprise copper.

12. The multilayer composite electronic structure of claim 1, further comprising an organic varnish applied over exposed ends of the outer via pillars to prevent oxidation of the via post metal.

13. The multilayer composite electronic structure of claim 1, wherein the outer via pillars are terminated with gold or nickel to prevent oxidation.

14. The multilayer composite electronic structure of claim 1, wherein at least one outer layer via pillar has a diameter of less than 50 microns.

15. The multilayer composite electronic structure of claim 1, wherein at least one outer layer via pillar has a diameter of less than 40 microns.

16. The multilayer composite electronic structure of claim 1, wherein at least one outer layer via pillar has a diameter of 30 microns or less.

17. The multilayer composite electronic structure of claim 1, wherein thickness of the structure in the Z direction exceeds 50 microns.

18. The multilayer composite electronic structure of claim 1, wherein a termination pad layer and the at least one outer via pillar layer are fabricated by a process comprising:
 (a) obtaining a substrate including an underlying via post layer that is treated to expose the copper thereof;
 (b) covering the substrate with a seed layer;
 (c) applying a first layer of photoresist over the seed layer;
 (d) exposing and developing the photoresist to form a negative pattern of termination pads;
 (e) depositing metal into the negative pattern to fabricate the feature layer;
 (f) stripping away the first layer of photoresist;
 (g) applying a second layer of photoresist;
 (h) exposing and developing a negative pattern including a plurality of outer via pillars in the negative pattern;
 (i) depositing a metal layer into the negative pattern;
 (j) stripping away the photoresist leaving the feature layer and the plurality of outer via pillars upstanding;
 (k) removing the seed layer,
 (l) laminating a dielectric material over the plurality of via pillars in the outer via layer,
 (m) planarizing the dielectric material to expose ends of the plurality of via pillars.

19. The multilayer composite electronic structure of claim 18, wherein the dielectric layer is a solder mask.

20. The multilayer composite electronic structure of claim 18, wherein at least one of the following limitations applies:
 (i) the seed layer comprises copper; (ii) the metal layer comprises copper; (iii) the dielectric material comprises a polymer, (iv) the dielectric material further comprises ceramic or glass inclusions.

21. The multilayer composite electronic structure of claim 18, wherein the method comprises the further step: (n1) of applying an organic varnish over exposed ends of the copper pillars in the outer layer of via pillars.

22. The multilayer composite electronic structure of claim 18, wherein the method comprises the further step (n2) of depositing nickel or gold over exposed ends of the copper via pillars in the outer layer of via pillars.

23. The multilayer composite electronic structure of claim 1, wherein the at least one outer via pillar layer is fabricated by the steps of:
 (i) obtaining a substrate including an underlying feature layer where the copper thereof is exposed;
 (ii) covering the substrate with a seed layer;
 (iii) depositing a metal layer over the seed layer;
 (iv) applying a layer of photoresist over the metal layer;
 (v) exposing and developing a positive pattern of outer via pillars;
 (vi) etching away the metal layer exposed;
 (vii) stripping away the photoresist, leaving a plurality of via pillars in the outer via layer upstanding,
 (viii) removing the seed layer;
 (ix) laminating an outer dielectric material over the plurality of via pillars in the outer layer, and
 (x) planarizing and thinning to expose the metal of the outer layer of via pillars.

24. The multilayer composite electronic structure of claim 23, wherein at least one of the following limitations applies:
 (a) the seed layer comprises copper;
 (b) the via layer comprises copper;

(c) the outer dielectric material comprises a polymer, and (d) the outer dielectric material comprises solder mask.

25. The multilayer composite electronic structure of claim 23, wherein the method further comprises the step (xi)a of depositing a varnish over the exposed ends of the via pillars.

26. The multilayer composite electronic structure of claim 23, wherein the method further comprises the step (xi)b of depositing gold or nickel over the exposed ends of the outer via pillars.

27. The method of claim 22 further comprising attaching a chip to the substrate by:
   (p) positioning a chip having legs terminated with solder bumps in contact with exposed ends of the via pillars, and
   (q) applying heat to melt the solder bumps and to wet the ends of the outer vias with solder.

28. The method of claim 25, further comprising (o) removing an organic varnish to expose the ends of the copper via pillars;
   (p) positioning a chip having legs terminated with solder bumps in contact with exposed ends of the via pillars, and
   (q) applying heat to melt the solder bumps and to wet the ends of the outer vias with solder.

29. The method of claim 18 further comprising attaching a chip by:
   (n) positioning a chip having legs terminated with a Z-directional anisotropic conductive film in contact with exposed ends of the via pillars, and
   (o) applying pressure in the Z-direction.

* * * * *